(12) United States Patent
Chao et al.

(10) Patent No.: US 9,673,112 B2
(45) Date of Patent: Jun. 6, 2017

(54) METHOD OF SEMICONDUCTOR FABRICATION WITH HEIGHT CONTROL THROUGH ACTIVE REGION PROFILE

(71) Applicant: Taiwan Semiconductor Manufacturing Company, Ltd., Hsin-Chu (TW)

(72) Inventors: Yi-Cheng Chao, Hsin-Chu (TW); Che-Cheng Chang, Taipei (TW); Po-Chi Wu, Zhubei (TW); Jung-Jui Li, Hsinchu (TW)

(73) Assignee: Taiwan Semiconductor Manufacturing Company, Ltd., Hsin-Chi (TW)

( * ) Notice: Subject to any disclaimer, the term of this patent is extended or adjusted under 35 U.S.C. 154(b) by 0 days.

(21) Appl. No.: 14/975,525

(22) Filed: Dec. 18, 2015

(65) Prior Publication Data

US 2016/0240444 A1    Aug. 18, 2016

Related U.S. Application Data

(60) Provisional application No. 62/116,257, filed on Feb. 13, 2015.

(51) Int. Cl.
*H01L 21/66* (2006.01)
*H01L 21/762* (2006.01)

(52) U.S. Cl.
CPC ........ *H01L 22/20* (2013.01); *H01L 21/76224* (2013.01); *H01L 22/12* (2013.01)

(58) Field of Classification Search
CPC .................. H01L 22/20; H01L 21/76224
See application file for complete search history.

(56) References Cited

U.S. PATENT DOCUMENTS

| 7,534,686 | B2 | 5/2009 | Lee et al. |
|---|---|---|---|
| 7,667,271 | B2 | 2/2010 | Yu et al. |
| 7,910,453 | B2 | 3/2011 | Xu et al. |
| 8,264,032 | B2 | 9/2012 | Yeh et al. |
| 8,377,779 | B1 | 2/2013 | Wang |
| 8,399,931 | B2 | 3/2013 | Liaw et al. |
| 8,487,378 | B2 | 7/2013 | Goto et al. |
| 8,580,642 | B1 | 11/2013 | Maszara et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |

(Continued)

FOREIGN PATENT DOCUMENTS

| JP | 2005064500 A | 3/2005 |
|---|---|---|
| JP | 2010034467 A | 2/2010 |

(Continued)

*Primary Examiner* — Kyoung Lee
(74) *Attorney, Agent, or Firm* — Haynes and Boone, LLP

(57) ABSTRACT

The present disclosure provides a method for fabricating an integrated circuit in accordance with some embodiments. The method includes forming a trench on a semiconductor substrate, thereby defining fin active regions; extracting a profile of the fin active regions; determining an etch dosage according to the profile of the fin active regions; filling in the trench with a dielectric material; and performing an etching process to the dielectric material using the etch dosage, thereby recessing the dielectric material and defining a fin height of the fin active regions.

20 Claims, 17 Drawing Sheets

(56) References Cited

U.S. PATENT DOCUMENTS

| | | |
|---|---|---|
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,809,171 B2 | 8/2014 | Xu et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,860,148 B2 | 10/2014 | Hu et al. |
| 8,887,106 B2 | 11/2014 | Ho et al. |
| 9,029,226 B2 | 5/2015 | Tsai et al. |
| 9,166,053 B2 * | 10/2015 | Kuo ................. H01L 29/785 |
| 2014/0001574 A1 | 1/2014 | Chen et al. |
| 2014/0110755 A1 | 4/2014 | Colinge |
| 2014/0151812 A1 | 6/2014 | Liaw |
| 2014/0282326 A1 | 9/2014 | Chen et al. |

FOREIGN PATENT DOCUMENTS

| | | |
|---|---|---|
| TW | 201110352 A | 3/2011 |
| TW | 201401513 A | 1/2014 |
| TW | 201427005 A | 7/2014 |
| TW | 201436052 A | 9/2014 |

\* cited by examiner

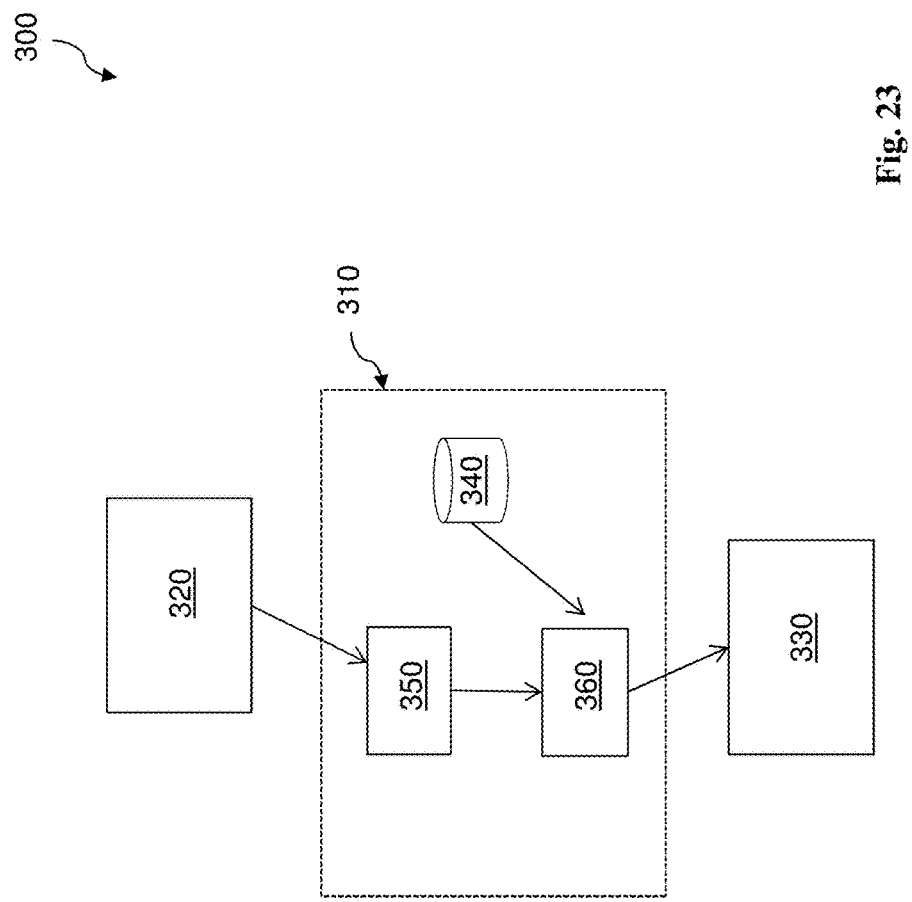

US 9,673,112 B2

METHOD OF SEMICONDUCTOR FABRICATION WITH HEIGHT CONTROL THROUGH ACTIVE REGION PROFILE

CROSS-REFERENCE

This application claims priority to U.S. Provisional Patent Application Ser. No. 62/116,257, filed on Feb. 13, 2015, the entire disclosure of which is hereby incorporated herein by reference.

BACKGROUND

In advanced technology nodes of integrated circuit industry, the critical dimensions of semiconductor devices become smaller and smaller. Various new compositions and structures are adopted. For examples, a high k dielectric material and metal are used to form a gate stack of a field-effect transistor (FET) such as a metal-oxide-semiconductor field-effect transistor (MOSFET). Three dimensional (3D) fin field effect transistors (FINFETs) are also used. However, in the FINFETs, the fin active regions are extruded above the semiconductor substrate. It is challenging to control the height of the fin active regions uniformly from wafer to wafer, lot to lot, product to product. Accordingly, the circuit performance and quality are impacted. For example, in existing methods to form the metal gate stack, metal gates are formed in a gate-replacement process that removes dummy gates and fills in the gate trenches with gate materials. Due to high packing density and small feature sizes, it is challenging to achieve proper gap filling and profile control, especially for the FINFETs.

Therefore, a method and system to form integrated circuits of FINFETs are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 23 is a schematic view of an exemplary embodiment of a system in which the method of FIG. 1 is implemented.

DETAILED DESCRIPTION

Figure 1:
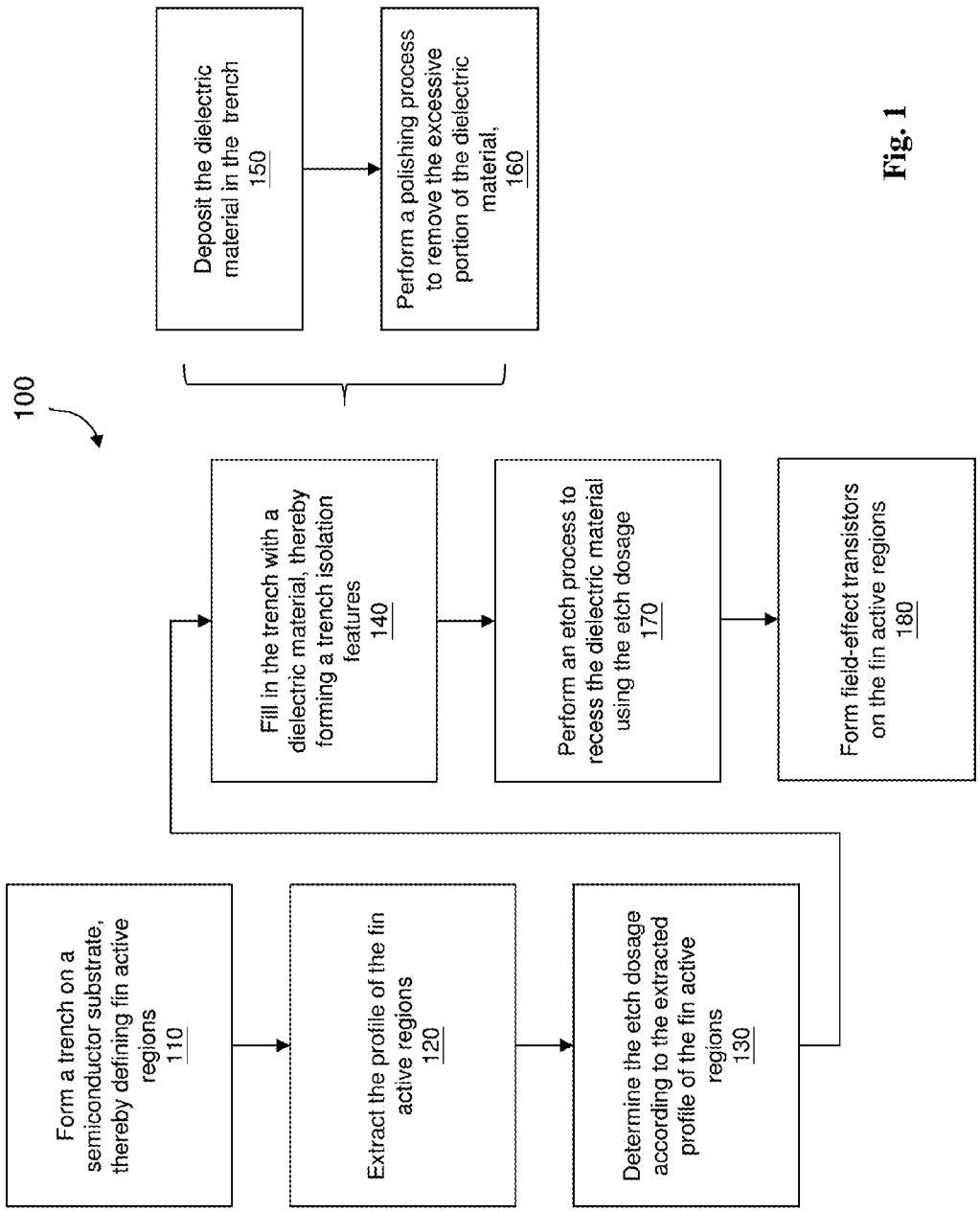
FIG. 1 is a flowchart of a method making a semiconductor structure, constructed in accordance with some embodiments.
Figure 3:
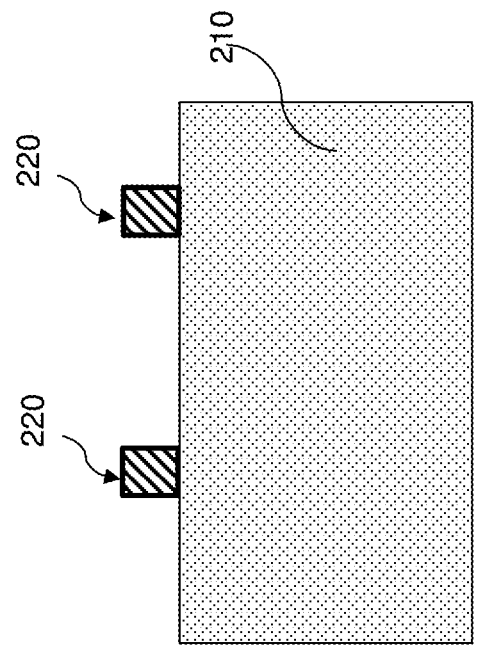
FIGS. 2-8 and 15 are sectional views of a semiconductor structure at various fabrication stages, constructed in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 10:
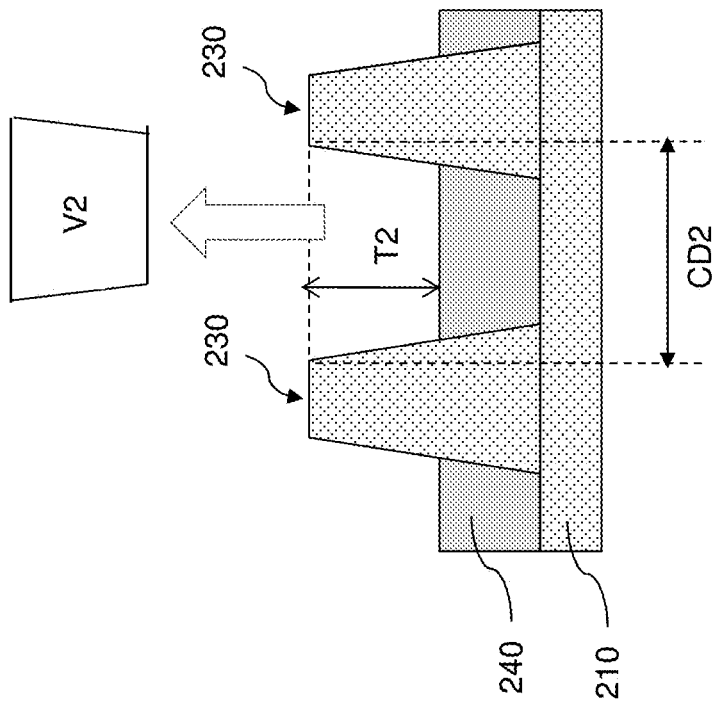
FIGS. 9 and 10 are sectional views of a semiconductor structure, constructed in accordance with some embodiments.

FIG. 1 is a flowchart of a method 100 making a semiconductor structure having fin active regions constructed according to aspects of the present disclosure. FIGS. 2-8 and 15 are sectional views of a semiconductor structure 200 at various fabrication stages in accordance with some embodiments. FIGS. 9 and 10 are sectional views of a semiconductor structure constructed in accordance with various examples. The semiconductor structure 200 and the method 100 of making the same are collectively described.

Figure 2:
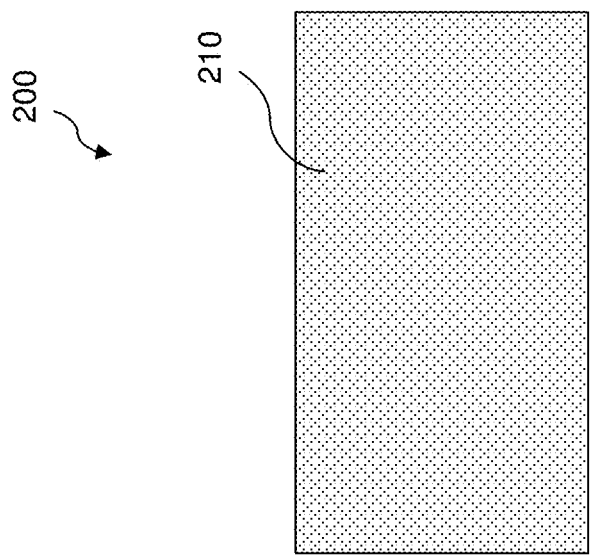

Referring to FIGS. 1 and 2, the method 100 begins by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide, gallium arsenic, GaAsP, AlInAs, AlGaAs, GaInP, or other proper combination thereof.

Figure 4:
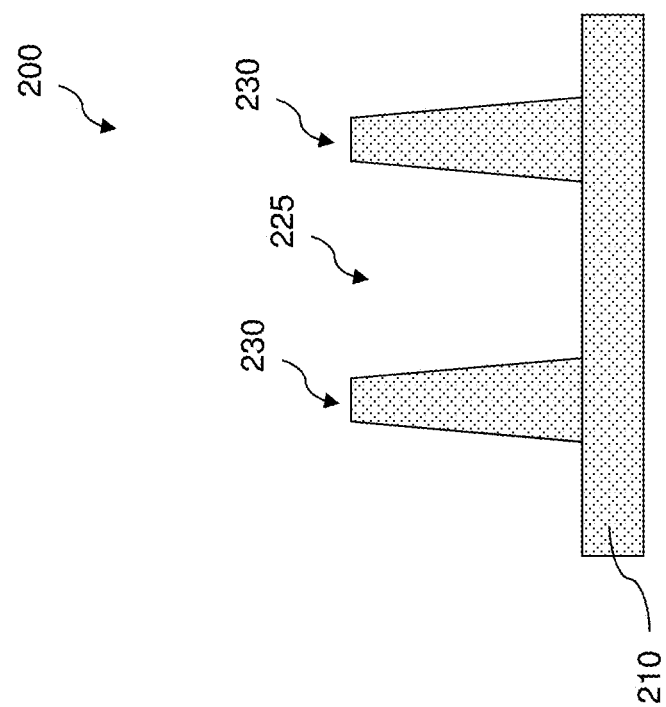

The method 100 proceeds to an operation 110 by forming one or more trenches in the semiconductor substrate 210. In some embodiments, the formation of trenches includes forming an etch mask 220 that defines areas for fin active regions, as illustrated as FIG. 3; and further includes performing an etching process to the semiconductor substrate 210 through the openings of the etch mask 220, thereby transferring a pattern from the etch mask 220 to the semiconductor substrate 210, as illustrated in FIG. 4. In some embodiments, the etch mask 220 is a hard mask effectively resists an etching process. The hard mask includes one or more dielectric material layer. In some examples, the hard mask includes silicon oxide, silicon nitride, silicon carbide or silicon oxynitride. In one example, the hard mask includes a silicon oxide layer and a silicon nitride layer formed on the silicon oxide layer. The formation of the hard mask includes deposition and patterning. For example, the deposition of the hard mask includes forming a silicon oxide layer by a thermal oxidation process and forming a silicon nitride layer by a chemical vapor deposition (CVD) process. The patterning of the hard mask includes forming a patterned photoresist layer on the hard mask, etching the hard mask through the openings of the patterned photoresist layer, and stripping the photoresist layer. The patterned photoresist is formed by a procedure that includes photoresist coating, soft baking, mask aligning, pattern exposing, post-exposure baking, photoresist developing, and hard baking, according to some embodiments. The patterned photoresist layer may also be formed or replaced by other suitable methods such as maskless photolithography, electron-beam writing, ion-beam writing, and molecular imprint. In other embodiments, the etch mask 220 is a soft mask, such as the patterned photoresist layer, that is able to effectively resist the etching process applied to the semiconductor substrate 210.

The operation 110 includes an etching process applied to the semiconductor substrate 210 through the openings of the etch mask 220, thereby forming one or trenches 225 and fin active regions 230, as illustrated in FIG. 4. The fin active regions 230 are protruded out and provide 3D active features. The etching process applied to the semiconductor substrate 210 may include dry etch, wet etch or a combination thereof. In some embodiments, a wet etching process is applied to the silicon substrate with an etchant that includes KOH solution. In some embodiments, a dry etching process is applied to the silicon substrate with an etchant that includes a fluorine-containing gas, a chlorine-containing gas, or a combination thereof, such as CF4, SF6, NF3, or Cl2. In some embodiments, the etch mask 220 is removed at this present fabrication stage after the formation of the trenches 225, such as by an etching process.

Figure 5:
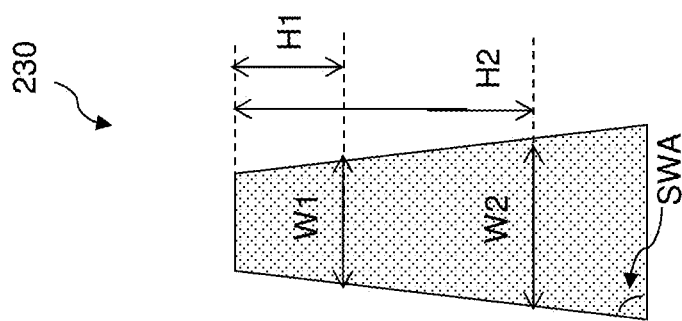

FIG. 5 is a sectional view of the semiconductor structure 200, in portion, constructed in accordance with some embodiments. Referring to FIGS. 1 and 5, the method 100 includes an operation 120 extracting the profile of the fin active regions 230, or particularly extracting profile parameters of the fin active regions 230. In some embodiments, the profile parameters of the fin active regions 230 include a sidewall angle (SWA) of the fin active regions 230. In some embodiments, the profile parameters of the fin active regions 230 include SWA and other parameters, such as the horizontal trench dimension spanning between the adjacent fin active regions 230. In some embodiments, the fin active regions may have more complicated profile and may need more profile parameters.

The operation 120 includes a measuring process to extract the profile of the fin active regions 230 using suitable metrology technology and metrology tool. In some embodiments, the profile of the fin active regions 230 is measured by an optical critical dimension (OCD) metrology tool. The OCD technology is a critical dimension measurement technology used to precisely determine the dimensions (such as width, height or sidewall angle) of a circuit feature on the semiconductor wafer. The OCD technology combines non-contact optical technology with powerful data analysis software to provide highly accurate measurement results for line width, height and sidewall angles. This technology is available in both standalone and integrated platforms. In furtherance of the embodiments, a scatterometry-based optical critical dimension metrology (OCD) is used to measure the profile of the fin active regions 230, with the benefit that it provides a nearly non-demolition measurement to the integrated circuit structure. Furthermore, OCD is impervious to the edge roughness of the fin active regions 230. In some other embodiments, other metrology tools, such as scanning electron microscope (SEM), may be additionally or alternatively used to extract the profile of the fin active regions 230.

Due to the sidewall angle, the horizontal dimension of the fin active regions 230 is different when measured from different level. As illustrated in FIG. 5, the width of the fin active region 230, measured at the height H1 from the top surface of the fin active region 230, is W1. The width of the fin active region 230, measured at the height H2 from the top surface of the fin active regions 230, is W2. When H2 is greater than H1, usually W2 is greater than W1. The parameter SWA is related to those dimensions by a formula, such as SWA=(H2−H1)/(W2−W1). When the profile of the fin active regions 230 is more complicated (such as curved sidewalls), the operation 120 may include extracting additional data or full profile if necessary. In some examples, the operation 120 includes measurement and data analysis such that proper parameter (such as SWA) is obtained. The profile of the fin active region 230 is used to determine the etch process at a later fabrication stage, the proper parameters of the profile of a fin active region are those relevant to the etch process.

In some embodiments, a plurality of fin active regions is measured for respective profiles. In this case, the profile is averaged over the plurality of fin active regions. For example, various fin active regions at different locations (such as wafer edges and wafer center) of the semiconductor substrate 210 are measured by OCD for respective SWAs. Then, an averaging process is applied to the SWAs to determine an average SWA of the semiconductor substrate 210. In some other embodiments, the average SWA may be an average SWA over a plurality of wafers in a batch, such as in a production lot.

Referring to FIG. 1, the method 100 also includes an operation 130 by determining an etch dosage for a subsequent etching process, which is implemented at a later stage and will be described later. The etch dosage is a parameter related to the etching process. For example, the etch dosage may be defined as the product of the etch strength and the etch duration. In some embodiments, when the etchant and etching condition (such as substrate temperature) are given, the etch dosage is determined by the etching duration. In this case, when the etch dosage is doubled, the etching duration is doubled.

In the operation 130, the etch dosage is determined according to the extracted profile of the fin active regions 230. In a particular example, the etch dosage is determined according to the SWA of the fin active regions 230. When SWA varies, the etch dosage is also adjusted accordingly such that the desired height of the fin active region 230 remains unchanged. Furthermore, the etch dosage is determined according to the extracted profile of the fin active regions 230 and the desired height of the fin active regions 230. The operation 130 provides a mechanism to tune/adjust the etch dosage as a function of the fin profile (e.g., SWA) such that the height of the fin active regions 230 remains substantially the same, from wafer to wafer and lot to lot. In some embodiments, the operation 130 includes determining the etch dosage by using a formula that associate the etch dosage to one or more parameter of the profile of the fin active regions. In some embodiments, the operation 130 includes determining the etch dosage by using a lookup table that associate the etch dosage to one or more parameter of the profile of the fin active regions. The lookup table may be created and updated according to the historic fabrication data. In some other embodiments, the operation 130 includes adjusting the etch dosage according to the variation of the profile of the fin active regions, either through a lookup table or a formula. The operation 130 will be further described with more details later after the etch process is introduced.

Referring back to FIG. 1, the method 100 proceeds to an operation 140 by filling in the trenches 225 with one or more dielectric material 240, such as silicon oxide, silicon nitride, silicon oxynitride, low k dielectric material, other suitable dielectric material or combinations thereof. The filled trench may have a multi-layer structure. In one example, the materials filling the trenches include a liner layer and another dielectric material that forms on the liner layer.

Figure 7:
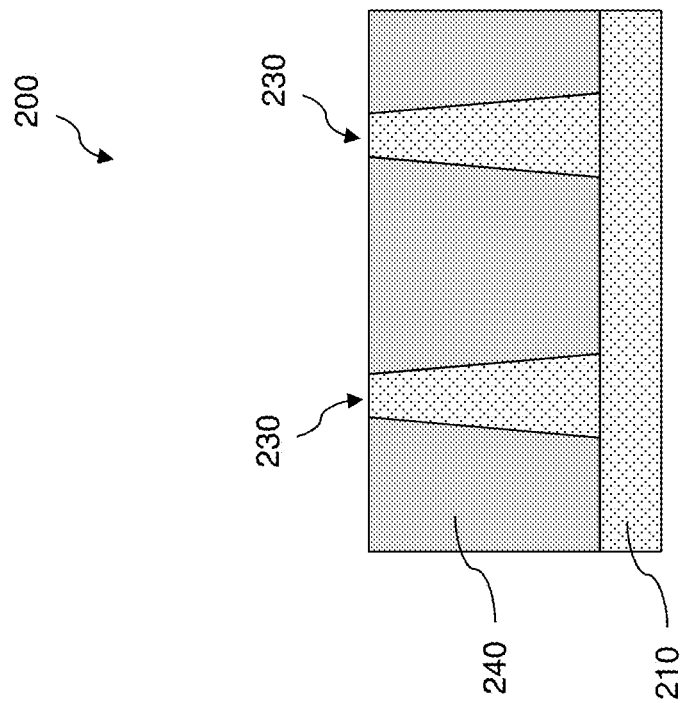
Figure 6:
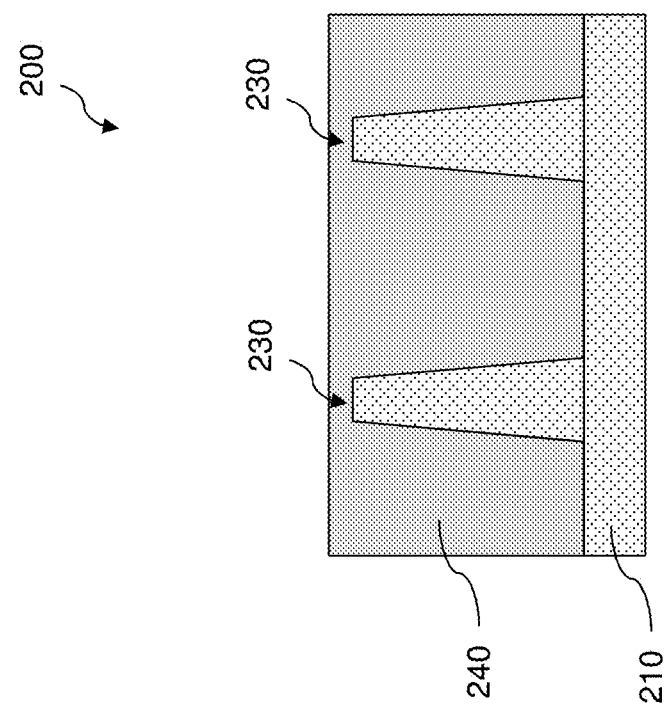

In some embodiments, the filling of the dielectric material 240 in the operation 140 includes deposition 150 (as illustrated in FIG. 6) and polishing 160 (as illustrated in FIG. 7). In some examples, the deposition 150 of the dielectric material 240 to the trenches 225 includes forming a thermal oxide liner layer and thereafter another dielectric material, such as silicon oxide by chemical vapor deposition (CVD), such as high density plasma CVD (HDPCVD) with both deposition and etching effects for better gap filling result. After the deposition 150, the dielectric material 240 is filled in the trenches 225 and may also be excessively formed on the fin active regions 230. Alternatively, the operation 150 may alternatively include other technique to form the dielectric material 240 in the trenches 225. For example, a silicon oxide may be formed in the trenches 225 by spin-on coating a chemical solution and curing the solution to form spin-on glass or polymer dielectric material.

In some examples, the polishing 160 includes a chemical mechanical polishing (CMP) process applied to the semiconductor substrate 210 to remove the excessive dielectric material 240 and to globally planarize the top surface of the semiconductor substrate 210, resulting in the isolation features formed between the fin active regions 230. In some examples, the operation 160 may alternatively include an etch-back process that removes both the dielectric material 240 and the fin active regions 230 at a substantially same rate.

Figure 8:
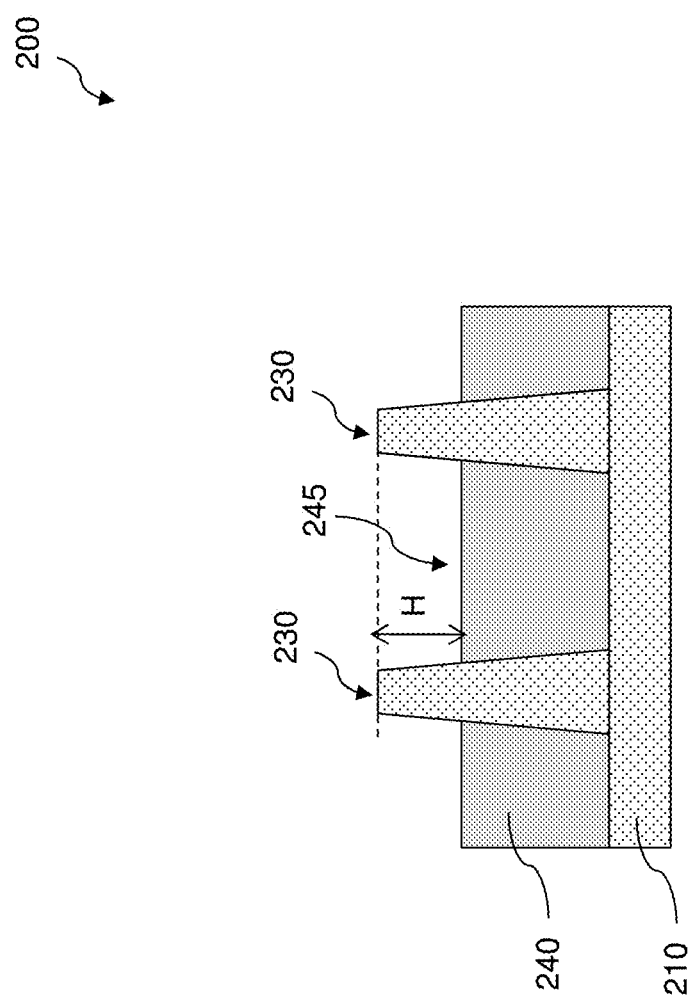
Figure 9:
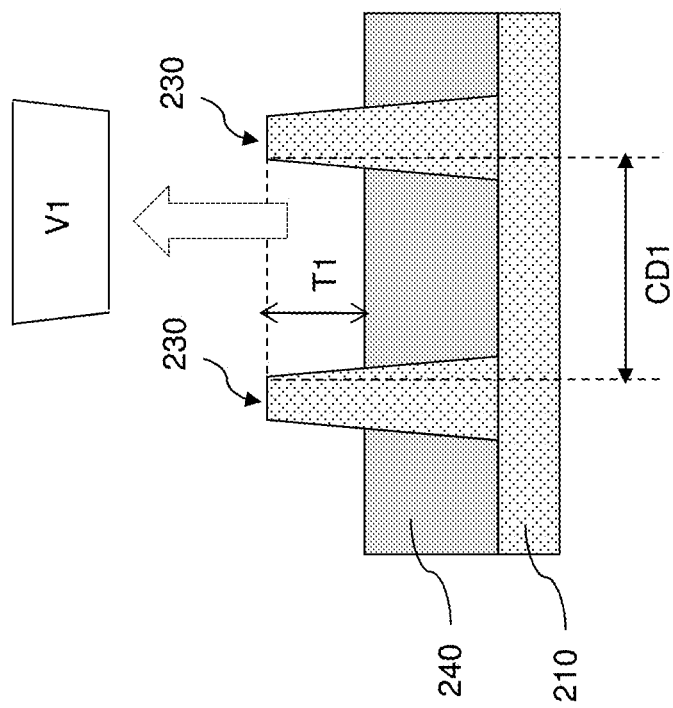

Referring to FIGS. 1 and 8, the method 100 proceeds to an operation 170 by performing an etching process to the semiconductor structure 200 to selectively etch the dielectric material 240 and recess the dielectric material 240, thereby forming shallow trench isolation (STI) features 245 and defining the fin active regions 230 with a certain height H. The etching process is designed to have the etch dosage determined at the operation 130. Particularly, the etch dosage is determined or adjusted according to the profile of the fin active regions 230, in order to achieve a uniform height of the fin active regions 230 from wafer to wafer and from lot to lot. Particularly, the etch dosage is determined or adjusted according to one or more profile parameters extracted from the profile of the fin active regions 240. In some examples, the profile parameters include sidewall angle. In other examples, the profile parameters include sidewall angle and the dimension of the trenches 225. In various embodiments, the etch process includes wet etch, dry etch, or a combination designed to selectively etch the dielectric material 240. For example, when the dielectric material 240 includes silicon oxide, the etch process may include a wet etch with etchant having diluted hydrofluoric acid (DHF).

The height H of the fin active regions 230 is defined in the specification of the corresponding product. When the variation of the height H is beyond a tolerable range defined by the specification, the performance of the corresponding circuit in the semiconductor structure 200 is substantially degraded. In the advanced technology nodes with smaller feature sizes, the controlling of the height H of the fin active regions is more challenging. Since the uniform fin height directly impacts to the device performance and reliability, especially for 3D structure with FINFETs and advanced technologies with much smaller feature sizes. The disclosed method provides an approach to dynamically tune/adjust the etch dosage according to the profile of the active regions 230, which effectively reduces the variation of the height of the fin active regions. The etch dosage is defined in the recipe of the etch process. In some embodiments, the etch dosage is defined by the etching duration when other parameters (such as etching chemical and the temperature of the etchant) of the etching process are given. Its mechanism is further explained below.

Through our experiments, it is found that the etch thickness is impacted by an etch volume (the volume of the dielectric material to be removed), which is referred to as a etch volume effect. For example, the removed volume of the dielectric material 240 in a given area is proportional to the chemical supply of the etchant, and therefore is proportional to the etch dosage.

FIGS. 9 and 10 illustrate two semiconductor structures substantially similar but having fin active regions with different profiles, particularly with different SWAs. The fin active regions in FIG. 8 have a first SWA and the fin active regions in FIG. 9 have a second SWA different from the first SWA. By applying a same etching process with a same etch dosage, the thicknesses of the removed portions of the dielectric material are different, such as T1 and T2, respectively, as illustrated in FIGS. 9 and 10. As the first SWA is greater, the first etched dielectric thickness T1 is less. The etching process is impacted by the horizontal trench dimension (such as the dimension CD1 that spanning between two adjacent fin active regions, as illustrated in FIG. 9 or CD2 in FIG. 10) since it determines the chemical supply during the etching process. The etching process is also related to the SWA since it determines how much amount of the dielectric material to be removed in order to reach a certain recessing depth. By the same etching process with a same etch dosage, a first volume V1 of the dielectric material 240 is removed in the semiconductor structure of FIG. 8 and a second volume V2 of the dielectric material 240 is removed in the semiconductor structure of FIG. 9. When the CD1 and CD2 are same, the chemical supplies are same. In this case, V1 is substantially equal to V2. Accordingly, the second thickness T2 is different from the first thickness T1 since the second SWA is different from the first SWA. In this particular example, the second thickness T2 is greater than the first thickness T1 since the second SWA is less than the first sidewall angle.

With consideration of the etch volume effect, the operations 120 extracts the profile of the fin active regions 230 and the operation 130 determines the etch dosage according to the profile of the fin active regions 230 and further according to the desired fin height H such that the fin height is substantially same from wafer to wafer, and from a lot to a lot. Even the previous processes (such as operation 110) may introduce variations, causing the profile of the fin active regions 230 different, the variation of the fin height is eliminated or minimized by implementing the operations 120, 130 and 150.

In various embodiments, the operations 130 may be implemented differently. For example, a lookup table is built up based on historic data to pair etch dosage to SWA. When SWA is extracted by the operation 120, the etch dosage is determined according to the SWA using the saved lookup table. In another example, a baseline etch dosage is determined according to a baseline SWA. When the extracted SWA is changed, a relative change of the etch dosage is determined according to a formula (a linear formula or a non-linear formula, depending on the complexity of the profile and the characteristic of the etch process).

In another example, the variation of the etch dosage is proportional to the variation of SWA in a small range.

Therefore, the ratio of the dosage variation to the SWA variation is a constant for the given etch apparatus and the given etch process. The historic manufacturing data associated with the etch apparatus and the etch process are used to determine the ratio. Thus, the operation 130 includes determining the dosage change according to the SWA change using the determined ratio. The ratio may be adjusted according to the new manufacturing data, thus catching the shifting of the etch process and other associated shifting.

The present method 100 may include other alternatives. For example, the etch mask 220 may be removed by an etching process prior to the CMP process, be removed by the CMP process, or remain during the CMP process as a polishing mask. In the last case, the etch mask 220 may be removed by an etching process after the CMP process. In some embodiments illustrated in FIGS. 3-7, the etch mask 220 is removed prior to the operation 140.

Figure 12:
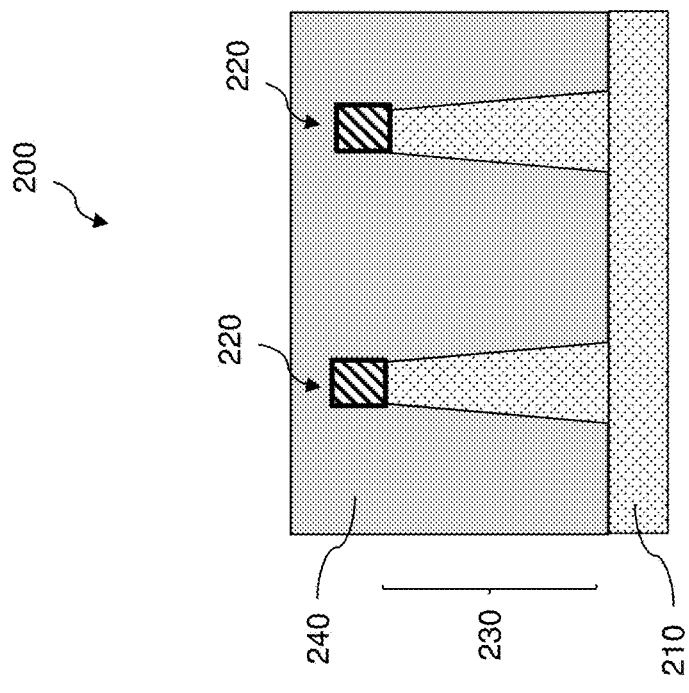
FIGS. 11-14 are sectional views of a semiconductor structure at various fabrication stages, constructed in accordance with some other embodiments.
Figure 11:
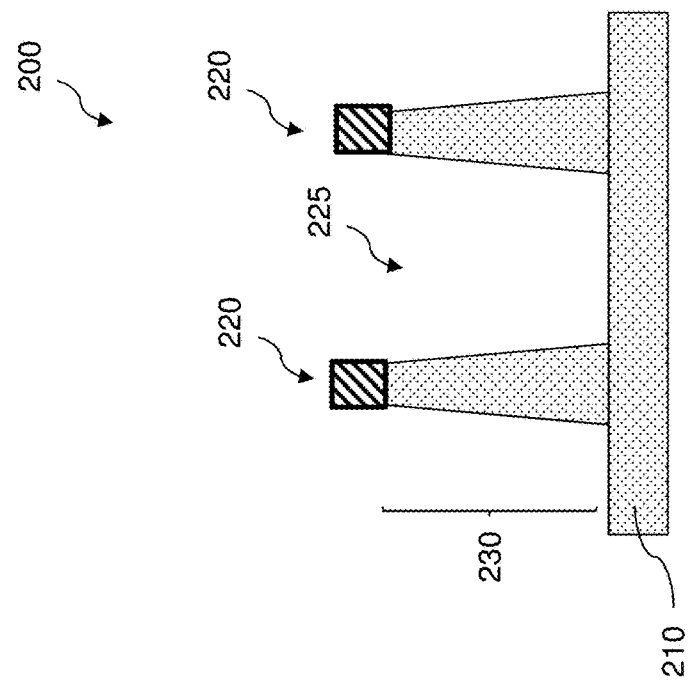
Figure 14:
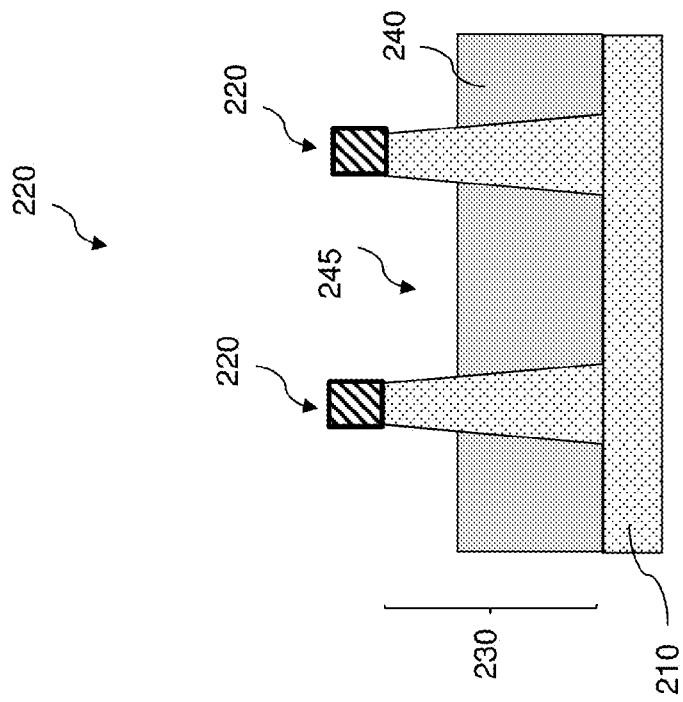
Figure 13:
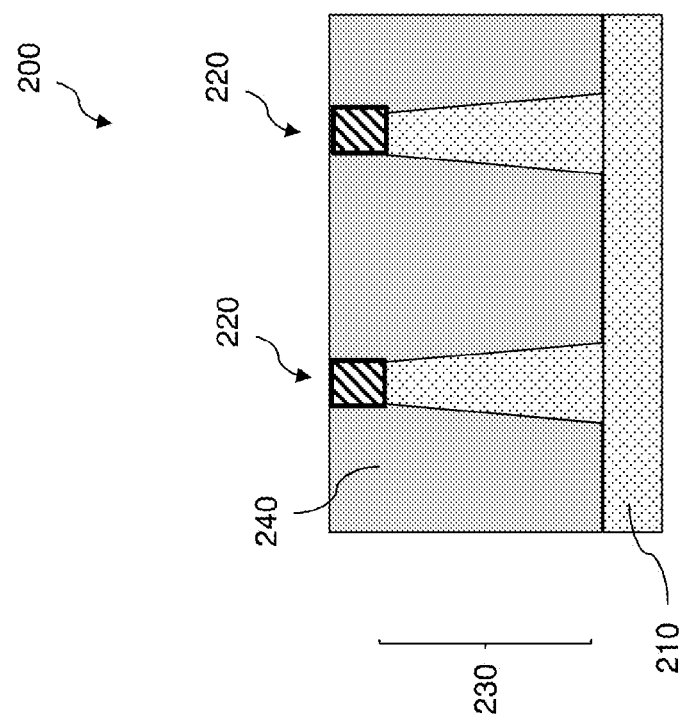

In other embodiments as illustrated in FIGS. 11-15, the etch mask 220 remains after the CMP process. Particularly, after the operation 110, the trenches 225 are formed, the etch mask 220 remains on the top of the fin active regions 230, as illustrated in FIG. 11. In the operation 150, the dielectric material 240 is deposited in the trenches 25 and may be deposited on the etch mask 220 as well, as illustrated in FIG. 12. In operation 160, a CMP process is applied to the dielectric material 240 to remove the excessive portion above the etch mask 220. The CMP process may stop on the etch mask 220 using the etch mask 220 as a polishing stop layer, as illustrated in FIG. 13. By the approach, the thickness of the dielectric material 240 is better controlled. In the operation 170, the etch process recesses the dielectric material 240, thereby forming the shallow trench isolation features 245, as illustrated in FIG. 14. During the etch process, the etch mask 220 remains on the fin active regions 230 and further function as a protection layer to protect the fin active regions 230 from the damage by the etch process. Thereafter, the etch mask 220 is removed by a suitable technique, such as a wet etch with an etchant that selectively removes the etch mask 220, resulting in the semiconductor structure 200 illustrated in FIG. 8. The etch process in the operation 170 uses the etch dosage determined by the operation 130. However, in the present embodiment, the etch dosage thus determined is different from the etch dosage of the etch process in FIGS. 7-8 since the thicknesses of the dielectric material 240 after the CMP in operation 160 and before the etch process are different due to the etch mask 220.

Referring to FIG. 1, the method 100 may further include other operations before, during and/or after the above operations. In some embodiments, the method 100 includes an operation 180 to form various devices, such as FETs, on the fin active regions 230. Accordingly, those FETs are referred to as fin field-effect transistor (FINFETs).

Figure 15:
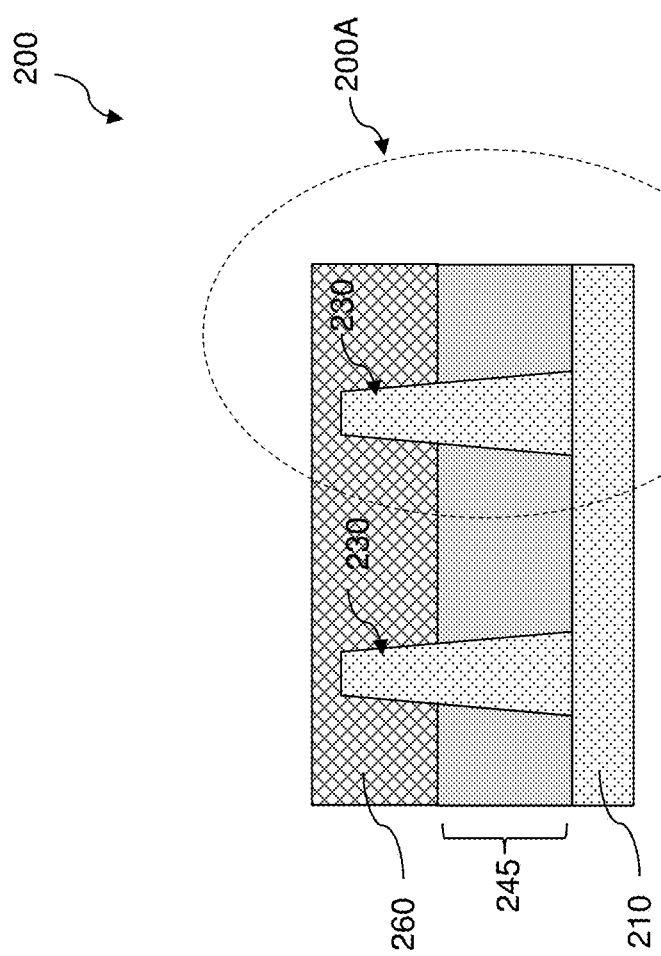

In some embodiments, the formation of the FINFETs includes forming gate stacks 260 of the FINFETs, as illustrated in FIG. 15. The gate stacks 260 include a gate dielectric layer and a gate conductive layer formed on the gate dielectric layer. The gate stack may be formed by a gate replacement process. In the gate replacement process, dummy gates are formed, source and drain features are formed thereafter, and then the dummy gates are replaced by metal gate with high k dielectric material and metal.

In some embodiments, the gate dielectric layer includes a high k dielectric material layer formed on the fin active regions 230. The gate dielectric layer may further include an interfacial layer (IL) interposed between the fin active regions 230 and the high k dielectric material layer.

In furtherance of the embodiments, the interfacial layer includes silicon oxide formed by a proper technique, such as an atomic layer deposition (ALD), thermal oxidation or UV-Ozone Oxidation. The high-k dielectric layer includes a dielectric material having the dielectric constant higher than that of thermal silicon oxide, about 3.9. The high k dielectric layer is formed by a suitable process, such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer includes metal nitrides, metal silicates or other metal oxides.

The gate conductive layer includes one or more conductive material, such as doped polysilicon, silicide, metal or metal alloy. In some examples, the gate conductive layer includes aluminum, copper, tungsten, or other suitable conductive material. In various examples, the gate conductive layer may include more than conductive layers, such as capping layer, a work function layer with a proper work function tuned for each type (n-type or p-type) FETs and filling metal (such as aluminum).

The gate stack may be formed by a gate replacement process. In the gate replacement process, dummy gates are formed, source and drain features are formed thereafter, and then the dummy gates are replaced by metal gate with high k dielectric material and metal. The formation of the source and drain features may include forming light doped drain (LDD) features and then heavily doped source and drain (S/D). The formation of the source and drain features may involve one or more ion implantation process. In some embodiments, strained source and drain features are formed by etching the source and drain regions to form source and drain recesses, filling the recesses by epitaxailly growing one or more semiconductor material different from that of the semiconductor substrate for straining effect to enhance the carrier mobility in the channel regions. The source and drain features may be in situ doped during the epitaxy growth.

The semiconductor structure 200 having one or more FINFET devices and the operation 180 are further described below in accordance with some embodiments. The semiconductor structure 200 in the following figures may only include a portion (the portion 200A) of FIG. 15 for simplicity. Even though the semiconductor structure 200 in the following figures may illustrates one fin active region 230 and one gate stack, however, it is understood that the semiconductor structure 200 may include a plurality of fin active regions 230 and a plurality of gate stacks in various configurations, such as a plurality of gate stacks configured in parallel and each of the gate stack disposed over the plurality of the fin active regions 230.

After the operation 170, the fin active regions 230 may include semiconductor material same to that of the semiconductor substrate 210, such as silicon. Alternatively, the fin active regions 230 include semiconductor material different from that of the semiconductor substrate 210. The fin active regions 230 may include two or more semiconductor layers of different semiconductor materials configured according to individual applications, such as strained devices, high frequency devices or light-emitting diodes. For example, the fin active regions 230 include a first silicon layer, a silicon germanium layer on the first silicon layer and a second silicon layer on the silicon germanium layer. In another example, the fin active regions 230 include a first silicon germanium layer, a silicon layer on the first silicon germanium layer and a second silicon germanium layer on the silicon layer. In some embodiments, the various semiconductor layers in the fin active regions 230 are formed by selective epitaxy growth (SEG) performed before the operation 110. In other embodiments, the various semiconductor layers in the fin active regions 230 are formed by SEG performed after the operation 160. Particularly, after the operation 160, the fin active regions 230 are recessed and then semiconductor layers are formed by SEG in the recesses. A CMP process may be performed to planarize the top surface.

Figure 16:
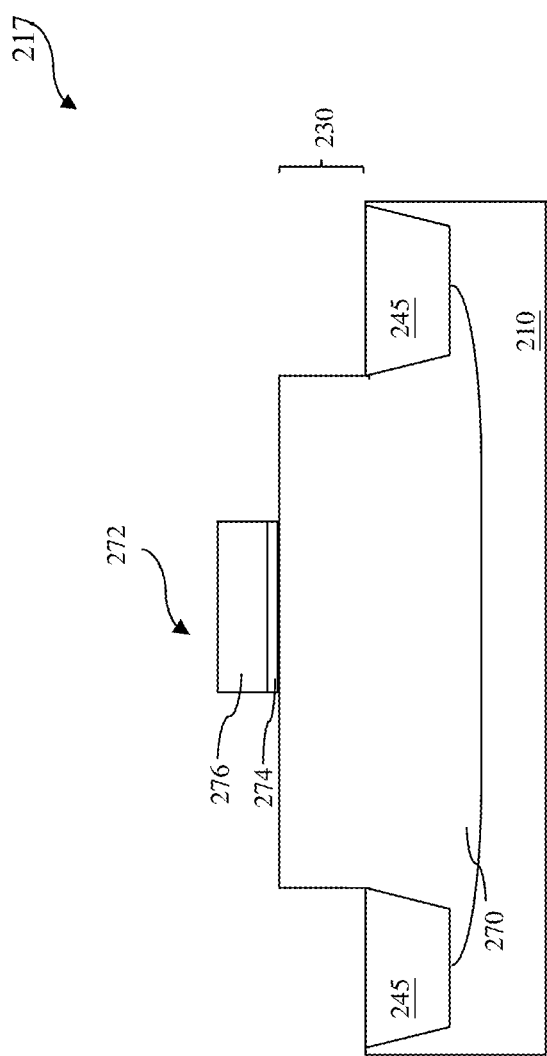
FIGS. 16-19 are sectional views of a semiconductor structure at various fabrication stages, constructed in accordance with some embodiments.

Referring to FIG. 16, a doped well 270 may be formed in the fin active region 230. In some embodiments, the fin active region 230 is designed to form a FET, such as a p-type FET (pFET) or an n-type FET (nFET). In some examples, a pFET is to be formed on the active region 214, and the doped well 270 includes an n-type dopant, such as phosphorous (P). In some other examples, an nFET is to be formed on the active region 230, and the doped well 270 includes a p-type dopant, such as boron (B), distributed in an active region. The dopant may be introduced the substrate 210 to form the doped well 270 by a suitable doping process, such as one or more ion implantation.

Still referring to FIG. 16, one or more dummy gate stacks 272 are formed on the semiconductor substrate 210. The dummy gate stacks 220 include a gate dielectric layer 274 (such as silicon oxide) and a gate conductive layer 276 (such as polysilicon). The formation of the gate stack 270 includes deposition and patterning. The patterning further includes lithography process and etching. A hard mask layer may be further used to pattern the gate stack 270.

Figure 17:
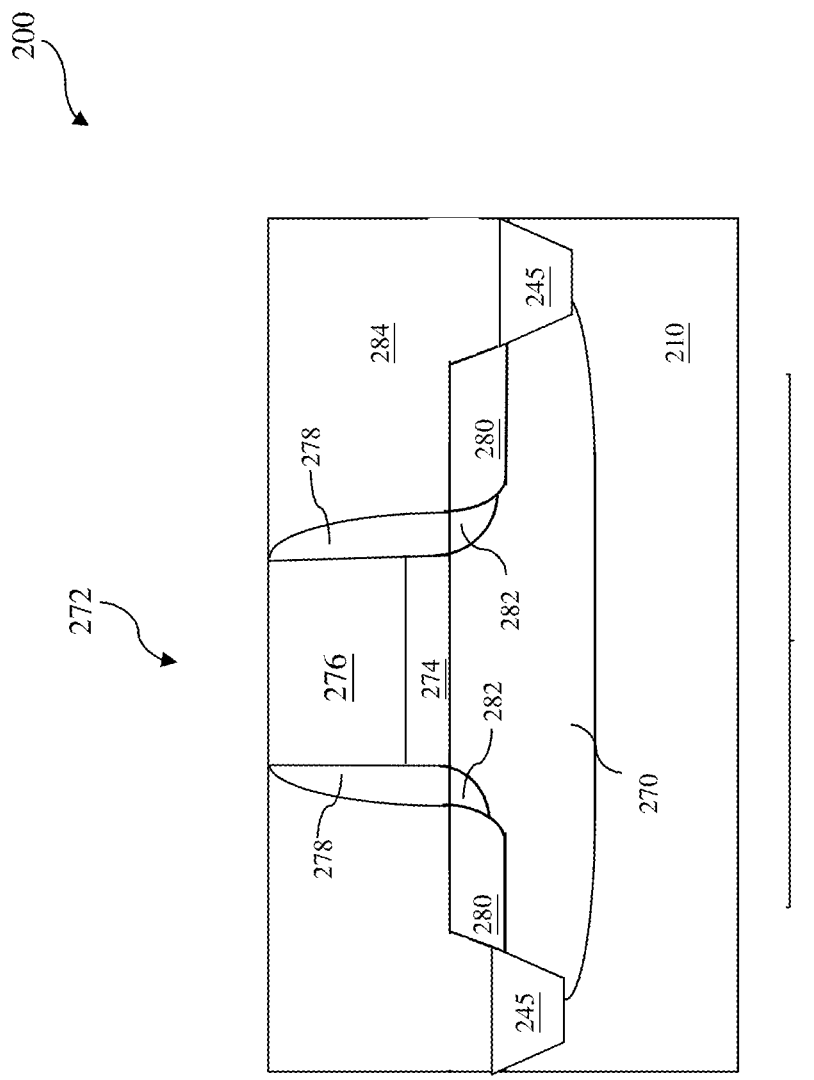

Referring to FIG. 17, source and drain (S/D) features 280 are formed in the fin active region 230. In some embodiments, gate spacer 278 and light doped drain (LDD) features 282 are further formed in the fin active region 230.

The gate spacer 278 includes a dielectric material, such as silicon oxide, silicon nitride, silicon oxynitride. The gate spacer 278 is formed on the sidewall of the gate stack 272 by a procedure that includes deposition and etching. The S/D features 280 and LDD features are formed by respective ion implantation. One or more thermal annealing process is followed to activate the doped species. The S/D features 280 and LDD features 282 include a same type conductivity and but different doping concentration. In one procedure, LDD features 282 are formed on the fin active region 230 with a first type of conductivity and a lower doping concentration; the gate spacer 278 is formed on the sidewall of the gate stack 272; and then the S/D features 280 are formed on the fin active region 230 with the first type conductivity and a higher doping concentration.

In some embodiments, the S/D features 280 are formed by epitaxy growth to enhance device performance, such as for strain effect to enhance mobility. In furtherance of the embodiments, the formation of the source and drain 280 includes selectively etching the substrate 210 to form the recesses; and eptaxy growing a semiconductor material in the recesses to form the S/D 280. The recesses may be formed using wet and/or dry etch process to selectively etch the material of the substrate 210. In furtherance of the embodiments, the gate stack 272, the gate spacers 278, and the STI 245 collectively function as an etching hard mask, thereby forming the recesses in the source and drain regions. In some examples, an etchant such as carbon tetrafluoride (CF4), tetramethylammonium hydroxide (THMA), other suitable etchant, or a combination thereof is used to form the recesses.

Thereafter, the recesses are filled with a semiconductor material by epitaxially growing S/D features 280 in crystalline structure. The epitaxy growth may include in-situ doping to form S/D with proper dopant. In some embodiments, the epitaxy growth is a selective deposition process that involves etching during the epitaxy growth, such that the semiconductor material is substantially grown on the semiconductor surfaces in the recess. Particularly, the selective deposition process involves chlorine for etching effect and makes the deposition selective. The selective deposition process is designed and tuned to epitaxially grow such that the S/D 280 formed in the recesses include the semiconductor material in a crystalline structure. The semiconductor material is different from that of the substrate 210. For example, the semiconductor material includes silicon carbide or silicon germanium while the substrate 210 is a silicon substrate. In some embodiments, the semiconductor material is chosen for proper strained effect in the channel region such that the corresponding carrier mobility is increased. In one example, the fin active region 230 is for a pFET, the semiconductor material is silicon germanium doped with boron for S/D 280 while the substrate 210 is a silicon substrate. In another example, the fin active region 230 is for an nFET, the semiconductor material is silicon carbide doped with phosphorous for S/D 280 while the substrate 210 is a silicon substrate.

In yet another embodiment, silicide features may be further formed on the source and drain regions to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to removed un-reacted metal.

Still referring to FIG. 17, an interlayer dielectric (ILD) 284 is formed on the substrate and the gate stack 272. The ILD 284 is deposited by a proper technique, such as CVD. The ILD 284 includes a dielectric material, such as silicon oxide, low k dielectric material or a combination. Then a chemical mechanical polishing (CMP) process may be applied thereafter to polarize the surface of the ILD 284. In one example, the gate stack is exposed by the CMP process for the subsequent processing steps. In another example that the hard mask to pattern the gate stack 272 is not removed at the previous operation, the CMP removes the hard mask as well. Alternatively the CMP stops on the hard mask and the hard mask is removed thereafter by an etch process.

Figure 18:
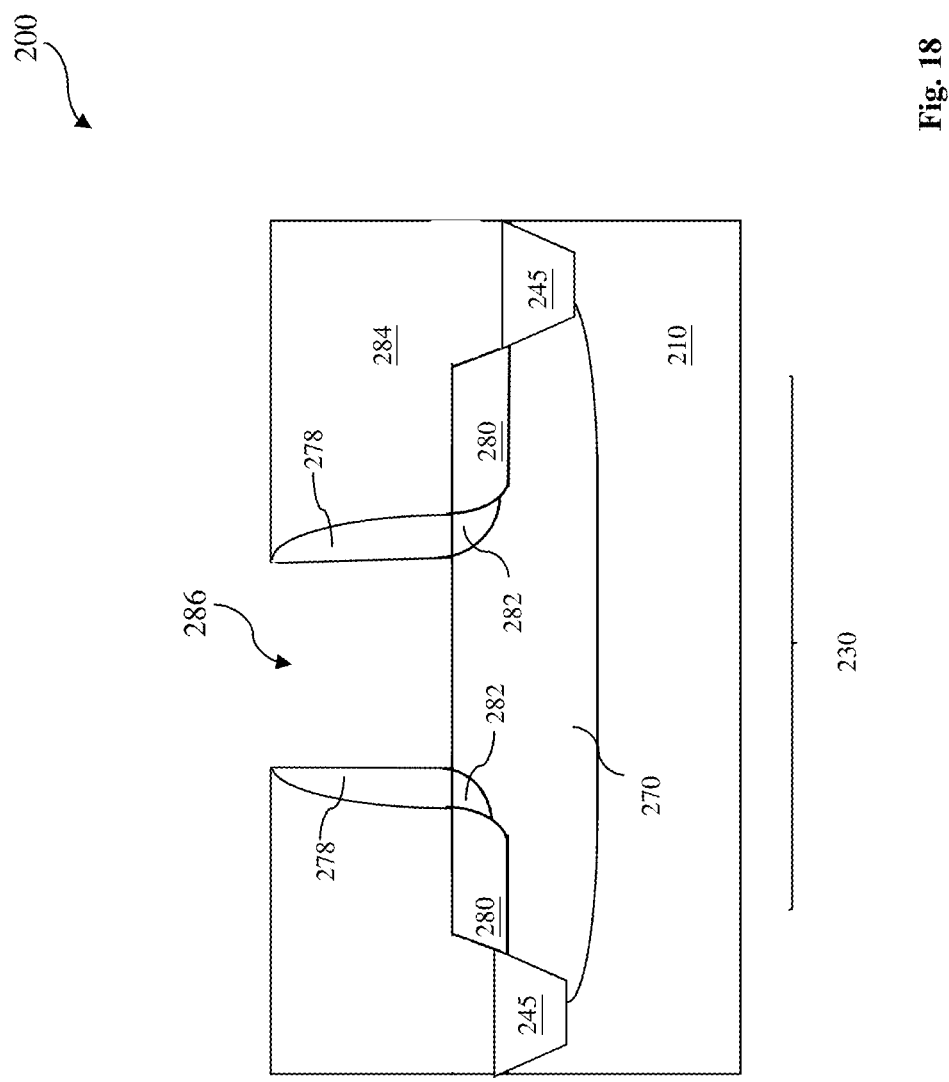

Referring to FIG. 18, the dummy gate stack 272 is partially or completely removed, resulting in a gate trench 286. The removal of the dummy gate includes one or more etching steps to selectively remove the gate conductive layer 276 or alternatively the gate stack 272 by a suitable etching process, such as one or more wet etch, dry etch or a combination.

Figure 19:
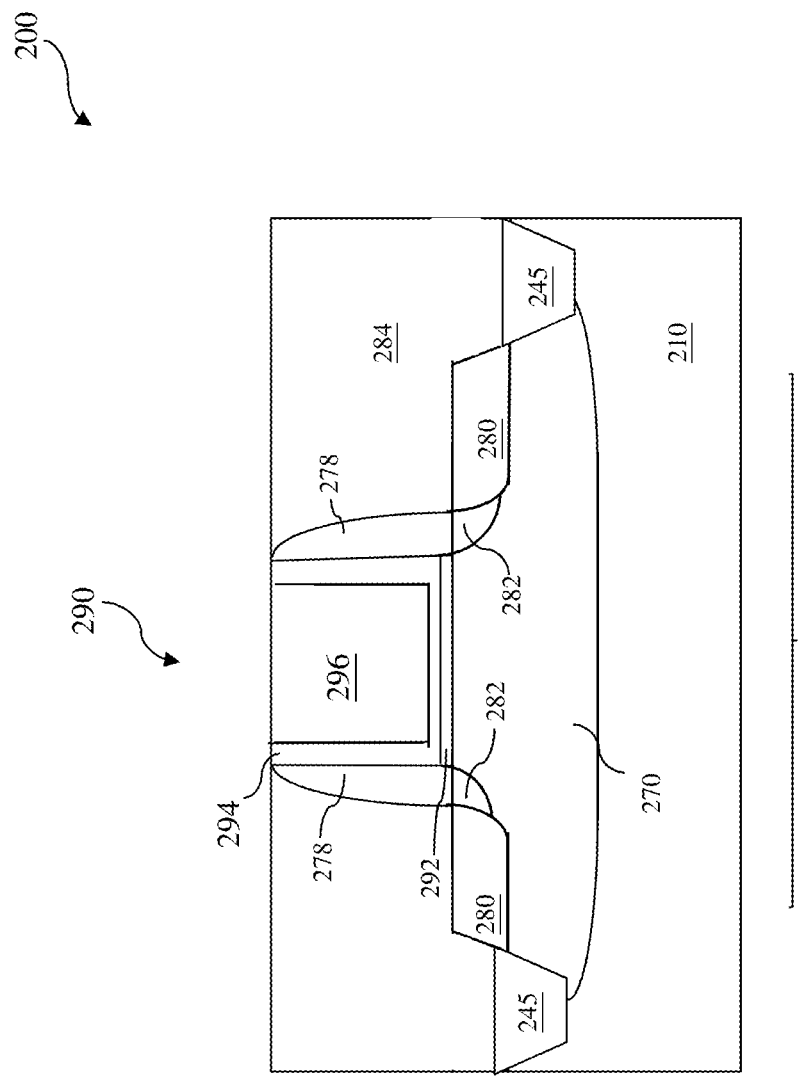

Referring to FIG. 19, the various gate material layers are filled in the gate trench 286, forming a metal gate 290 in the gate trench 286. In some embodiments such as in high-k last process, the gate material layers includes a gate dielectric layer 294 and a gate conductive layer (or gate electrode) 296. The gate dielectric layer 294 includes a high-k dielectric material. The gate conductive layer 296 includes metal. In some embodiments, the gate conductive layer 296 include multiple layers, such as a capping layer, a work function metal layer, a blocking layer and a filling metal layer (such as aluminum or tungsten). The gate material layers may further include an interfacial layer 292, such as silicon oxide, interposed between the substrate 210 and the high-k dielectric material. The interfacial layer 292 is a portion of the gate dielectric layer. The various gate material layers are filled in the gate trench 286 by deposition, such as CVD, PVD, plating, ALD or other suitable techniques.

The high-k dielectric layer 294 includes HfO2, or alternatively metal nitrides, metal silicates or other metal oxides. The high k dielectric layer 294 is formed by a suitable process such as ALD. Other methods to form the high k dielectric material layer include MOCVD, PVD, UV-Ozone Oxidation or MBE.

Figure 20:
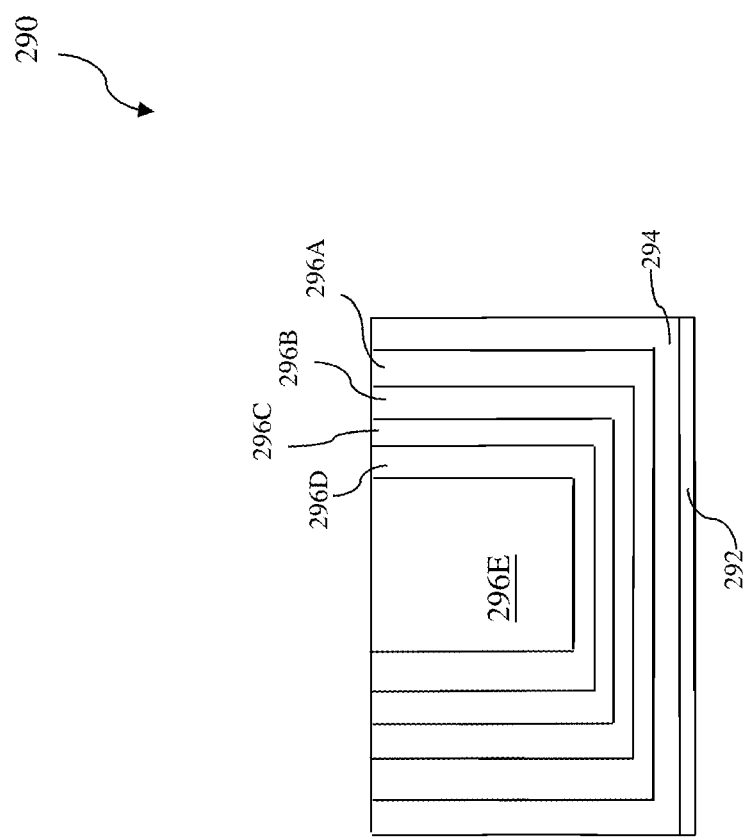
FIG. 20 is a sectional view of a gate stack of the semiconductor structure in FIG. 19, constructed in accordance with some embodiments.

In one embodiment illustrated in FIG. 20 in a sectional view, the gate electrode 256 includes a capping layer 296A, a blocking layer 296B, a work function metal layer 296C, another blocking layer 296D and a filling metal layer 296E. In furtherance of the embodiments, the capping layer 296A includes titanium nitride, tantalum nitride, or other suitable material, formed by a proper deposition technique such as ALD. The blocking layer 296B includes titanium nitride, tantalum nitride, or other suitable material, formed by a proper deposition technique such as ALD.

The work functional metal layer 296C includes a conductive layer of metal or metal alloy with proper work function such that the corresponding FET is enhanced for its device performance. The work function (WF) metal layer 296C is different for a pFET and a nFET, respectively referred to as an n-type WF metal and a p-type WF metal. The choice of the WF metal depends on the FET to be formed on the active region 230. For example, the semiconductor structure 200 includes a first active region 230 for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WK metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher.

In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 296D includes titanium nitride, tantalum nitride, or other suitable material, formed by a proper deposition technique such as ALD. In various embodiments, the filling metal layer 296E includes aluminum, tungsten or other suitable metal. The filling metal layer 296E is deposited by a suitable technique, such as PVD or plating.

Figure 21:
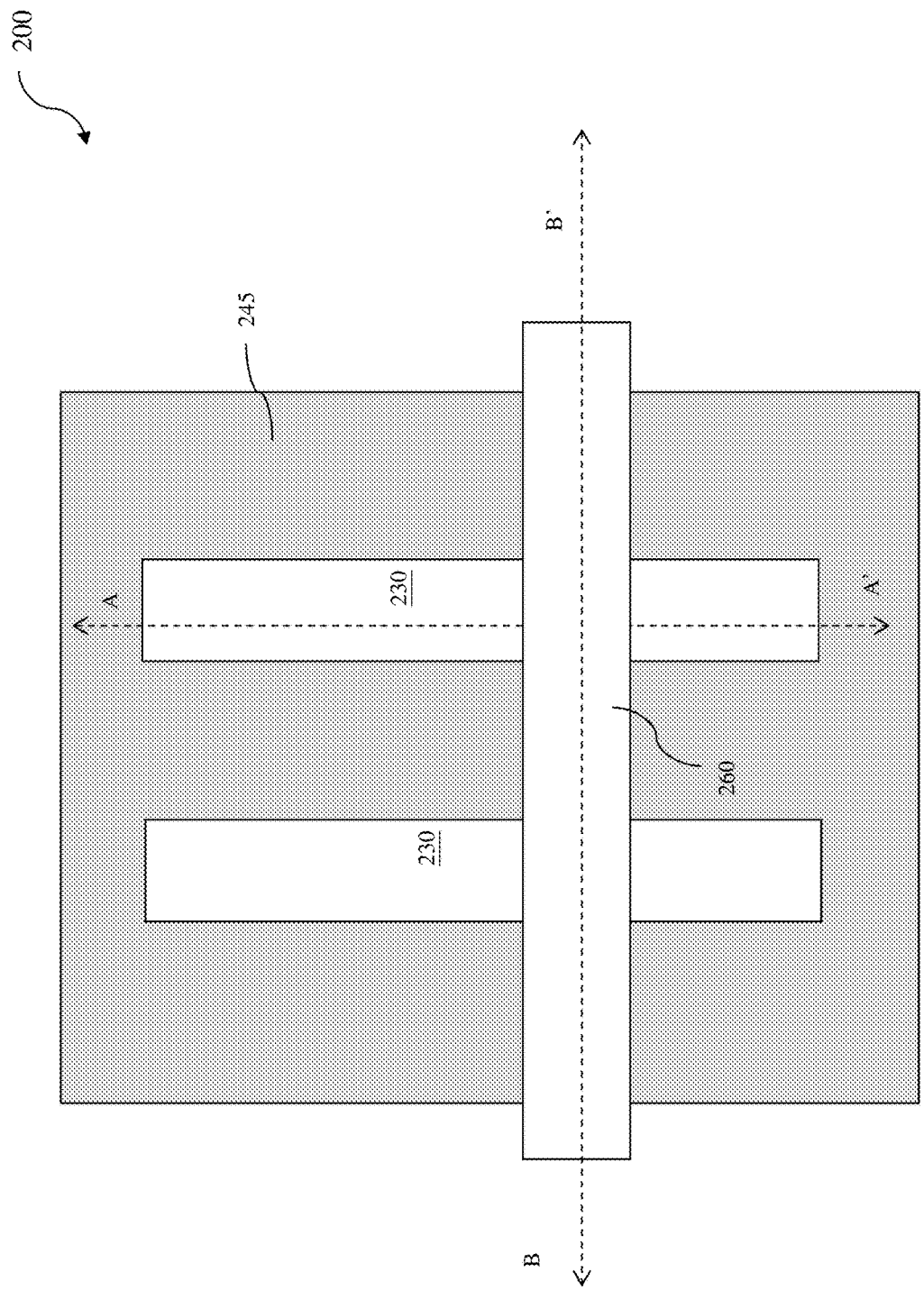
FIG. 21 is a top view of the semiconductor structure in FIG. 19, constructed in accordance with some embodiments.
Figure 22:
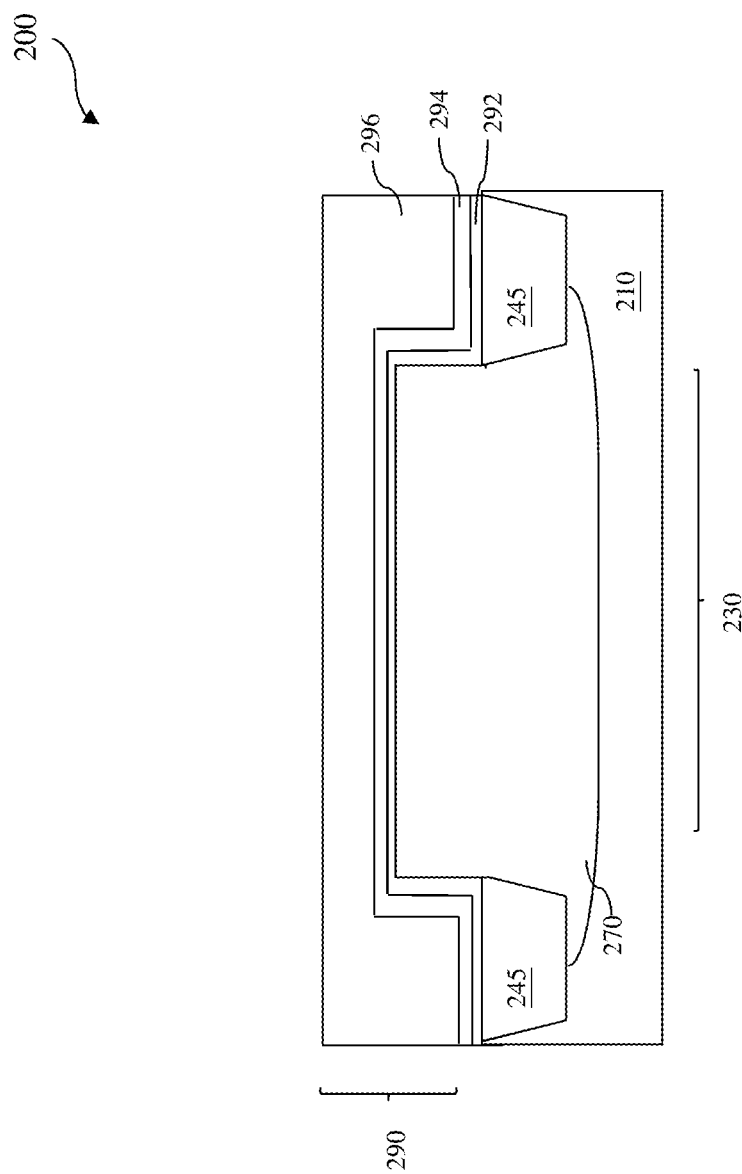
FIG. 22 is a sectional view of the semiconductor structure of FIG. 21, constructed in accordance with some embodiments.

The semiconductor structure 200 in FIG. 19 is further illustrated in FIGS. 21 and 22 as well. FIG. 21 is a top view of the semiconductor structure 200. FIGS. 19 and 22 are sectional views of the semiconductor structure 200 along the dashed lines AA' and BB' of FIG. 21, respectively. FIG. 21 illustrates two fin active regions 230 but FIG. 22 only illustrates one fin active region 230 for simplicity. It is understood that semiconductor structure 200 may include two or more fin active regions 230 and two or more gate stacks 290. Various corresponding nFETs, pFETs and other circuit devices are formed on the substrate 210. Particularly, the gate 290 is disposed on the fin active region 230 and the isolation features 245. The first portion of the gate 290 on the fin active region 230 and the second portion of the gate 290 on the isolation features 245 have respective bottom surfaces at different levels (not coplanar in other words).

Referring back to FIG. 1, the method 100 may include other fabrication operations. In some embodiments, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

FIG. 23 illustrates a schematic view of an exemplary embodiment of a manufacturing system 300 to implement the method 100, constructed in accordance with some embodiments. The apparatus 300 includes a manufacturing module 310 coupled with a metrology tool 320 and an etch apparatus 330. The metrology tool 320 may be an OCD tool in one example. The etch apparatus 330 is the tool to perform the etching process of the operation 170. The manufacturing module 310 may be embedded in the etch apparatus 330 or distributed in the semiconductor manufacturing system. The manufacturing module 310 includes software, hardware and database 340. The database 340 is designed to keep and maintain the etch recipes, device specifications (such as fin height), historic fabrication data and/or a lookup table that matches the SWAs and the etch dosages. The manufacturing module 310 further includes a fin profile extraction module (FPE module) 350 designed to extract the profile of the fin active regions 230 (such as SWA). The FPE module 350 is coupled with the metrology tool 320 and extracts the fin profile based on the measurement by the metrology tool (the operation 120). The manufacturing module 310 further includes an etch dosage (ED) module 360 designed to determine the etch dosage of the etching process based on the extracted fin profile. Accordingly, the operation 130 is implemented by the ED module 360. The ED module 360 is coupled with the FPE module 350 for the fin profile and is coupled with the database 340 for various data (such as desired fin height). The ED module 360 is further coupled with the etch apparatus 330 to provide the determined etch dosage to the etch apparatus such that the etching process in the operation 170 is implemented by the etch apparatus 330 with the determined etch dosage, thereby forming the fin active regions 230 with fin height having minimized variation from wafer to wafer and from lot to lot. The system 300 may further include other modules, manufacturing apparatus and metrology tools coupled or integrated together. In various examples, various entities of the system 300 are coupled together through Internet, intranet or other cable/wireless communication means.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, and may be employed in many different applications, including sensor cells, memory cells, logic cells, and others.

The present disclosure provides a semiconductor structure and method making the same. The method includes extracting the profile of the fin active region, determining or adjusting the etch dosage according to the fin active region profile; and performing the etch process to recess the dielectric material using the etch dosage, thereby forming the fin active region and the shallow trench isolation features. The operation to determine the etch dosage may use a lookup table or a formula. Alternatively, a feed-forward loop is implemented such that the variation of the profile from a previous wafer is used to adjust the etch dosage of the subsequent wafer. Some embodiments of the present disclosure offer advantages over existing art, though it is understood that other embodiments may offer different advantages, not all advantages are necessarily discussed herein, and that no particular advantage is required for all embodiments. By using the disclosed method, the variation of the height of the fin active regions in the corresponding semiconductor structure is reduced and the device performance is enhanced. By using the disclosed method, fin height loading can be controlled too be less than 6 nm. The fin height loading is defined as fin height variation due to the fin height loading. For example, one structure has a dense fin pattern with 1000 fin features densely configured in parallel and another structure has an isolated fin pattern with 4 fin features isolated from other fin features. The fin height difference between the dense fin pattern in the first structure and the isolated fin pattern in the second structure is fin height loading. Our experiments consistently show that the fin height loading is: more than 6 nm if using the existing method; and less than 6 nm if using the disclosed method. Particularly, by using the disclosed method, the fin height loading is controlled to a range between 1 nm and 3 nm in some examples. Overall, with the disclosed method, the fin loading effect is substantially reduced in term of fin height variation, which provides significant improvement to the FinFET structure (or other 3D structure), especially for the advanced technology nodes with much smaller feature sizes. The etch process with optimized and dynamically adjusted etch dosage may be applied to other structure with similar profile-sensitive circuit features.

Thus, the present disclosure also provides a method for fabricating an integrated circuit in accordance with some embodiments. The method includes forming a trench on a semiconductor substrate, thereby defining fin active regions; extracting a profile of the fin active regions; determining an etch dosage according to the profile of the fin active regions; filling in the trench with a dielectric material; and performing an etching process to the dielectric material using the etch dosage, thereby recessing the dielectric material and defining a fin height of the fin active regions.

The present disclosure provides a method for fabricating an integrated circuit in accordance with some embodiments. The method includes forming first trenches on a substrate, thereby defining first ridge features on the substrate; measuring a sidewall angle (SWA) of the first ridge features; determining an etch dosage according to the SWA and a desired height; filling in the first trench with a material; and performing an etching process to the material with the etch dosage, thereby recessing the material and defining the first ridge features having the desired height.

The present disclosure provides a system for semiconductor fabrication in accordance with some embodiments. The system includes a metrology tool operable to measure profile of a fin active region formed on a semiconductor substrate; an etch apparatus operable to perform an etching process to the semiconductor substrate; and a manufacturing module coupled with the metrology tool and the etch apparatus, wherein the manufacturing module is designed to determine an etch dosage based on the profile of the fin active region.

Aspects of the present disclosure are best understood from the following above description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

Although only a few exemplary embodiments of this invention have been described in detail above, those skilled in the art will readily appreciate that many modifications are possible in the exemplary embodiments without materially departing from the novel teachings and advantages of this invention. It is understood that various different combinations of the above-listed steps can be used in various sequences or in parallel, and there is no particular step that is critical or required. Also, features illustrated and discussed above with respect to some embodiments can be combined with features illustrated and discussed above with respect to other embodiments. Accordingly, all such modifications are intended to be included within the scope of this invention.

What is claimed is:

1. A method, comprising:
    forming a trench on a semiconductor substrate, thereby defining fin active regions;
    extracting a profile of the fin active regions;
    determining an etch dosage according to the profile of the fin active regions;
    filling in the trench with a dielectric material; and
    performing an etching process to the dielectric material using the etch dosage, thereby recessing the dielectric material and defining a fin height of the fin active regions.

2. The method of claim 1, wherein the performing of the etching process to the dielectric material using the etch dosage includes forming the fin active regions with the fin height having a fin height loading that ranges between 1 nm and 3 nm.

3. The method of claim 1, wherein the forming of the trench includes forming an etch mask on the semiconductor substrate using a lithography process; and etching the semiconductor substrate through openings of the etch mask.

4. The method of claim 1, wherein the extracting of the profile of the fin active regions includes measuring a sidewall angle of the trench.

5. The method of claim 4, wherein the measuring of the sidewall angle includes measuring the sidewall angle by a scatterometry-based optical critical dimension metrology (OCD).

6. The method of claim 1, wherein the determining of the etch dosage includes determining the etch dosage according to the profile of the fin active region and a desired fin height.

7. The method of claim 1, wherein the filling of the trench with the dielectric material includes depositing the dielectric material in the trench and performing a chemical mechanical polishing process to the dielectric material.

8. The method of claim 1, where the etch dosage includes an etch duration with a given etchant.

9. The method of claim 1, further comprising:
forming a second trench on a second semiconductor substrate, thereby defining second fin active regions;
extracting a second profile of the second fin active regions;
adjusting the etch dosage if the second profile is different from the profile;
filling in the second trench with the dielectric material; and
performing a second etching process to the dielectric material using the adjusted etch dosage, thereby recessing the dielectric material and defining the second fin active regions of the fin height.

10. A method, comprising:
forming first trenches on a substrate, thereby defining first ridge features on the substrate;
measuring a sidewall angle (SWA) of the first ridge features;
determining an etch dosage according to the SWA and a desired height;
filling in the first trenches with a material; and
performing an etching process to the material with the etch dosage, thereby recessing the material and defining the first ridge features having the desired height.

11. The method of claim 10, wherein
the measuring of SWA of the first ridge feature includes measuring multiple locations on the substrate and generating an average SWA; and
the determining of the etch dosage includes determining the etch dosage according to the average SWA and the desired height.

12. The method of claim 10, wherein the measuring of the sidewall angle includes measuring the sidewall angle by a scatterometry-based optical critical dimension metrology (OCD).

13. The method of claim 10, wherein the determining of the etch dosage includes adjusting the etch dosage according to a variation of the SWA.

14. The method of claim 10, wherein the determining of the etch dosage includes checking a lookup table of paired SWAs and etch dosages; and selecting one of the etch dosages corresponding to one of the paired SWA closest to the measured SWA.

15. The method of claim 10, wherein the determining of the etch dosage includes determining the etch dosage according to the measured SWA and using a formula that relates the etch dosage as a function of the measured SWA.

16. The method of claim 10, wherein the filling of the first trenches includes depositing a dielectric material in the first trenches and performing a chemical mechanical polishing process to the dielectric material.

17. The method of claim 10, where the etch dosage includes an etch duration for a given etching process with a given etchant.

18. A system for semiconductor fabrication, comprising:
a metrology tool operable to measure profile of a fin active region formed on a semiconductor substrate;
an etch apparatus operable to perform an etching process to the semiconductor substrate; and
a manufacturing module coupled with the metrology tool and the etch apparatus, wherein the manufacturing module is designed to determine an etch dosage based on the profile of the fin active region.

19. The system of claim 18, wherein the manufacturing module further includes a database for maintaining production specifications and etching recipes;
a fin profile extraction (FPE) module coupled with the metrology tool to determine a sidewall angle (SWA) of the fin active region; and
an etch dosage module coupled with the FPE module and the database, wherein the etch dose module is designed to determine the etch dosage according to the SWA from the FPE module and a desired fin height from corresponding etching recipe of the database.

20. The system of claim 19, wherein the database further includes a lookup table pairing various SWAs and corresponding etch dosages.

* * * * *